(12) United States Patent
Chen et al.

(10) Patent No.: US 11,417,734 B2
(45) Date of Patent: Aug. 16, 2022

(54) METHOD FOR FABRICATING FLASH MEMORY

(71) Applicant: United Microelectronics Corp., Hsinchu (TW)

(72) Inventors: Chih-Jung Chen, Hsinchu County (TW); Yu-Jen Yeh, Taichung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/670,870

(22) Filed: Oct. 31, 2019

(65) Prior Publication Data
US 2021/0134967 A1    May 6, 2021

(51) Int. Cl.
| | |
|---|---|
| *H01L 21/762* | (2006.01) |
| *H01L 29/788* | (2006.01) |
| *H01L 21/28* | (2006.01) |
| *H01L 29/66* | (2006.01) |
| *H01L 21/3105* | (2006.01) |

(52) U.S. Cl.
CPC .. *H01L 29/40114* (2019.08); *H01L 21/76224* (2013.01); *H01L 29/6653* (2013.01); *H01L 29/788* (2013.01); *H01L 21/31051* (2013.01)

(58) Field of Classification Search
CPC ... H01L 21/00; H01L 29/00; H01L 27/11521; H01L 21/76224; H01L 29/66825; H01L 21/76232
See application file for complete search history.

(56) References Cited

U.S. PATENT DOCUMENTS

| | | | | |
|---|---|---|---|---|
| 6,319,759 B1* | 11/2001 | Furukawa | ......... | H01L 21/28211 |
| | | | | 438/151 |
| 6,448,606 B1* | 9/2002 | Yu | ......... | H01L 27/115 |
| | | | | 257/315 |
| 6,743,675 B2* | 6/2004 | Ding | ......... | H01L 29/7883 |
| | | | | 438/257 |
| 6,781,189 B2* | 8/2004 | Taylor | ......... | H01L 29/7881 |
| | | | | 257/317 |
| 7,319,618 B2 | 1/2008 | Wu et al. | | |
| 7,560,386 B2* | 7/2009 | Cha | ......... | H01L 21/76224 |
| | | | | 257/E21.32 |

(Continued)

FOREIGN PATENT DOCUMENTS

JP      2010103228 A   *   5/2010

OTHER PUBLICATIONS

C. Yeh et al., "A novel two-step poly CMP to improve dishing and erosion effect on self-aligned floating gate process," 2011 e-Manufacturing & Design Collaboration Symposium & International Symposium on Semiconductor Manufacturing (eMDC & ISSM), Hsinchu, 2011, pp. 1-10. (Year: 2011).*

(Continued)

*Primary Examiner* — Nicholas J Tobergte
*Assistant Examiner* — William H Anderson
(74) *Attorney, Agent, or Firm* — J.C. Patents

(57) ABSTRACT

A structure of flash memory cell includes a substrate. A floating gate is disposed on the substrate. A low dielectric constant (low-K) spacer is disposed on a sidewall of the floating gate. A trench isolation structure has a base part disposed in the substrate and a protruding part above the substrate protruding from the base part. The low-K spacer is sandwiched between the floating gate and the protruding part of the trench isolation structure.

7 Claims, 11 Drawing Sheets

(56) References Cited

U.S. PATENT DOCUMENTS

| | | | |
|---|---|---|---|
| 8,081,516 B2* | 12/2011 | Lee | H01L 29/40117 365/185.18 |
| 8,822,335 B2 | 9/2014 | Lee et al. | |
| 9,136,273 B1 | 9/2015 | Purayath et al. | |
| 2003/0119259 A1* | 6/2003 | Jeong | H01L 27/115 438/257 |
| 2005/0136800 A1* | 6/2005 | Miller | G01N 19/02 451/5 |
| 2015/0076606 A1* | 3/2015 | Cheng | H01L 29/66795 257/288 |
| 2016/0005833 A1 | 1/2016 | Collins et al. | |
| 2020/0176460 A1* | 6/2020 | Decobert | H01L 29/1033 |

OTHER PUBLICATIONS

Machine translation from Japanese to English, Ozaki (JP-2010103228-A) (Year: 2010).*

Espacenet.com machine translation from Japanese to English, Ozaki (JP-2010103228-A) (Year: 2010).*

\* cited by examiner

METHOD FOR FABRICATING FLASH MEMORY

BACKGROUND

1. Field of the Invention

The present invention generally relates to semiconductor fabrication, and particularly to a structure of flash memory cell and method for fabricating the same.

2. Description of Related Art

The non-volatile memory device is almost an absolutely required equipment in a digital electronic product. The digital electronic products such as computer system, mobile phone, camera, video apparatus, and so on, are also the necessary products in the daily life. Therefore, the non-volatile memory device is commonly required.

The non-volatile memory device in an example is a flash memory, including a control gate and a floating gate. The floating gate is involved to store the charges according to the binary data as stored.

When the device size is greatly reduced as intended, the gap between the cells is accordingly reduced. In accessing operation, the surrounding cells adjacent to the selected cell as currently accessed may be disturbed, then the cross-talk phenomenon between the target cell and the adjacent cells would occur. When the gap between the cells is greatly reduced, the parasitic capacitance between adjacent two FG's may get serious, and then the cross-talk effect gets serious. This effect would cause larger RC delay in operation.

The cell structure of flash memory is still under development, so to expect the improvement of the whole performance of the memory device.

SUMMARY OF THE INVENTION

The invention provides a structure of memory device. An isolation between the adjacent floating gates of the memory cells may be improved, while the gap between the floating gate in flash memory cells is reduced in fabrication trend.

In an embodiment, the invention provides a structure of flash memory cell includes a substrate. A floating gate is disposed on the substrate. A low dielectric constant (low-K) spacer is disposed on a sidewall of the floating gate. A trench isolation structure has a base part disposed in the substrate and a protruding part above the substrate protruding from the base part. The low-K spacer is sandwiched between the floating gate and the protruding part of the trench isolation structure.

In an embodiment, as to the structure of flash memory cell, the low-K spacer comprises a solid structure by the low-K dielectric.

In an embodiment, as to the structure of flash memory cell, the low-K spacer comprises an air spacer, having a free space filled with air.

In an embodiment, as to the structure of flash memory cell, it further includes a tunnel oxide layer between the substrate and the floating gate.

In an embodiment, as to the structure of flash memory cell, the tunnel oxide layer is disposed on the substrate between adjacent two of the base part of the trench isolation structure.

In an embodiment, as to the structure of flash memory cell, the protruding part of the trench isolation structure is narrower than a top of the base part.

In an embodiment, as to the structure of flash memory cell, the floating gate is extending over a portion of the base part of the trench isolation structure.

In an embodiment, as to the structure of flash memory cell, a top surface of low-K spacer is coplanar with a top surface of the floating gate.

In an embodiment, as to the structure of flash memory cell, a dielectric constant of the low-K spacer is smaller than a dielectric constant of the trench isolation structure.

In an embodiment, as to the structure of flash memory cell, the floating gate, the low-K spacer and the protruding part of the trench isolation structure form as a layer with uniform thickness.

In an embodiment, the invention provides a method for fabricating flash memory, including providing a substrate. A trench isolation structure is formed, having a base part disposed in the substrate and a protruding part above the substrate protruding from the base part. A dielectric spacer with low dielectric constant (low-K) is formed on a sidewall of the protruding part of the trench isolation structure. A floating gate is formed on the substrate abutting to the dielectric spacer. The dielectric spacer is sandwiched between the floating gate and the protruding part of the trench isolation structure.

In an embodiment, as to the method for fabricating flash memory, a dielectric constant of the dielectric spacer is smaller than a dielectric constant of the trench isolation structure.

In an embodiment, as to the method for fabricating flash memory, the method further includes removing the dielectric spacer to have a free space filled with air.

In an embodiment, as to the method for fabricating flash memory, the method further includes performing an oxidation process on the substrate before forming the floating gate to form a tunnel oxide layer between the substrate and the floating gate.

In an embodiment, as to the method for fabricating flash memory, the tunnel oxide layer is disposed on the substrate between adjacent two of the base part of the trench isolation structure.

In an embodiment, as to the method for fabricating flash memory, the step of forming the trench isolation structure comprising forming a plurality of dielectric islands on the substrate, wherein a gap is between adjacent two of the dielectric islands. Then a trench is formed in the substrate under the gap. Isolation material is disposed over the substrate to fill the trench and cover over the dielectric islands. The isolation material is polished to expose the dielectric islands, wherein the protruding part of the trench isolation structure is formed between the dielectric islands. The dielectric islands are removed.

In an embodiment, as to the method for fabricating flash memory, the floating gate is extending over a portion of the base part of the trench isolation structure.

In an embodiment, as to the method for fabricating flash memory, a top surface of dielectric spacer is coplanar with a top surface of the floating gate.

In an embodiment, as to the method for fabricating flash memory, a dielectric constant of the dielectric spacer is smaller than a dielectric constant of silicon oxide.

In an embodiment, as to the method for fabricating flash memory, the step of forming the floating gate comprising depositing a polysilicon layer over the substrate to at least cover over the protruding part of the trench isolation structure with the dielectric spacer. Then, the polysilicon layer is polished to expose the protruding part of the trench isolation structure with the dielectric spacer, wherein a residual part of the polysilicon layer provides the floating gate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to a structure of flash memory cells and the method for fabricating the flash memory cells. The flash memory cells as fabricated may have less parasitic capacitance between floating gates. At least the cross talk effect between the target cell and the adjacent cells may at least be reduced.

The invention has looked into the performance between of the flash memory, which may be greatly reduced in size as the fabrication trend. In this situation, the distance between memory cells is accordingly reduced. When the operation voltages are applied to the memory cell as accessed, the adjacent cells may influence the target cell due to capacitance coupling with RC delay. The kind of cross-talk effect would reduce the performance of operation.

Figure 1:
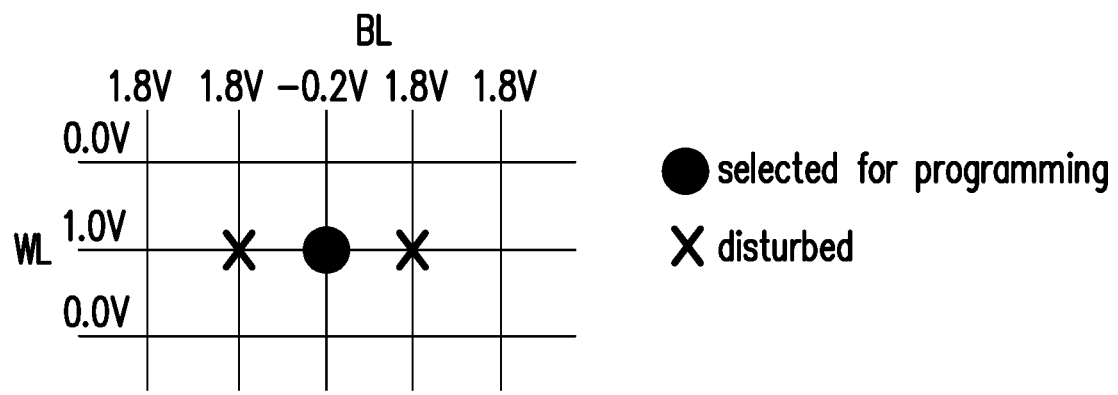
FIG. 1 is a drawing, schematically illustrating a mechanism of a cross-talk between memory cell during operation as looked into in the invention.

FIG. 1 is a drawing, schematically illustrating a mechanism of a cross-talk between memory cell during operation as looked into in the invention. Referring to FIG. 1, the invention has looked into the cross-talk effect in operation. During operation, a target memory cell, as indicated by round dot, is applied operation voltages at bit line (BL) and world line (WL). However, the other cells at the intersection nodes of the bit line (BL) and the word line (WL) not selected should be turned off by still applying a certain voltage on the bit line, in an example, so to assure the other cells are at OFF state.

However, the disturbed cells, as indicated by "x", adjacent to the target cell are disturbed, because the word line voltage is still applied. As a result, cross-talk effect may be more serious.

To at least reduce the cross-talk effect, the invention has looked into the fabrication process for the flash memory cell to find the issue and then may provide the modification to reduce the issue, so to improve the performance of the operation.

The invention provides multiple embodiments to describe the inventions, However, the invention is not just limited to the embodiments. In addition, suitable combinations between the embodiments may also be made to have further embodiments.

Figure 2A:
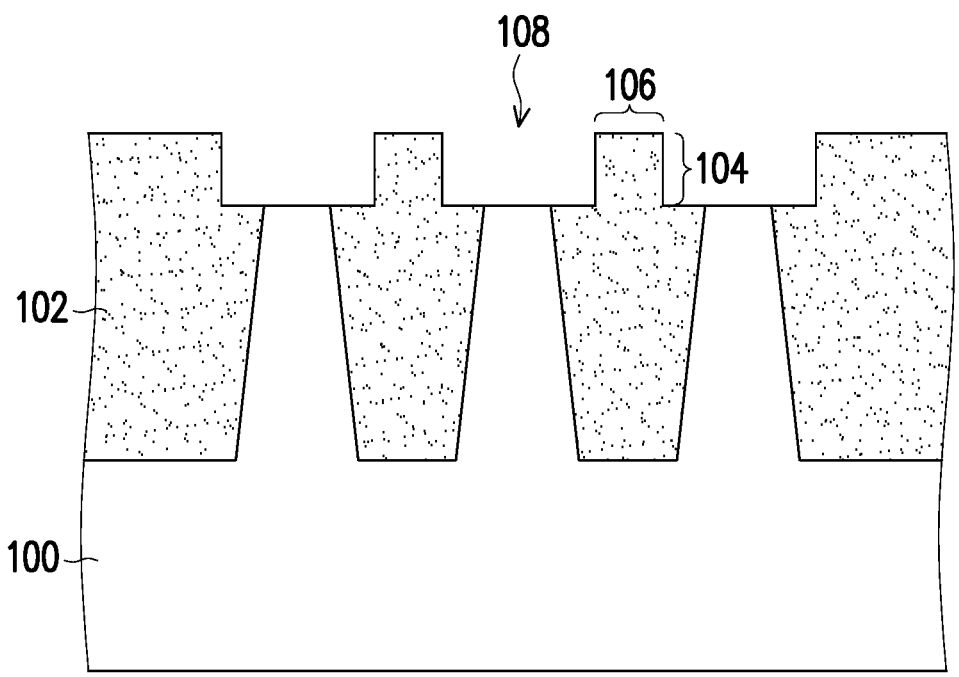
FIG. 2A to FIG. 2C are drawing, schematically illustrating process flows for fabricating a flash memory cell as looked into in the invention.
Figure 2B:
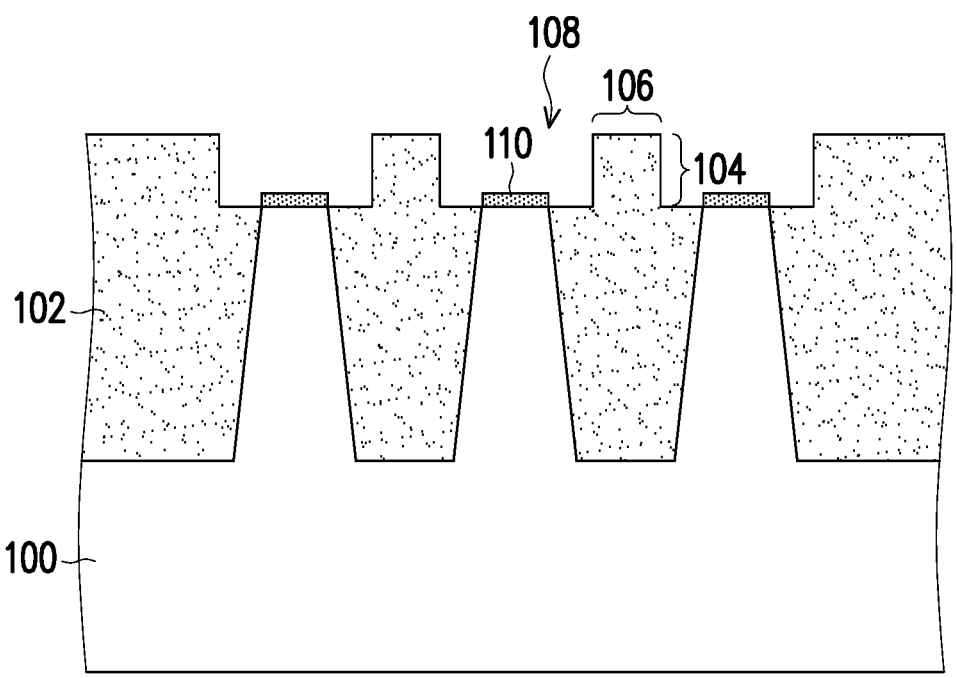
Figure 2C:
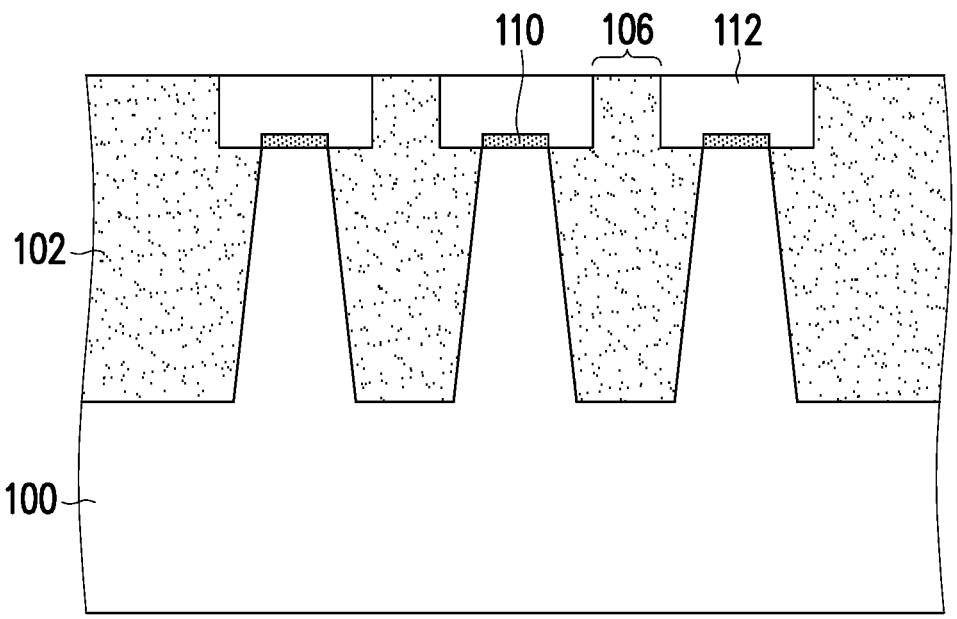

FIG. 2A to FIG. 2C are drawing, schematically illustrating process flows for fabricating a flash memory cell as looked into in the invention. Referring to FIG. 2A, a shallow trench isolation structure 102 has been formed in a substrate 100. The shallow trench isolation structure 102 includes a base part disposed in the substrate 100 and a protruding part 104 above the substrate 100, protruding from the base part. The protruding part 104 has the width 106 narrower than the top width of the base part, so that an indent region 108, as preserved to form the floating gate, is formed.

Referring 2B, a tunnel oxide layer 110 is formed on the exposed surface of the substrate 100 within the indent region 108. Referring to FIG. 2C, the floating gate 112, such as polysilicon gate, is formed in the indent region 108.

As looked into in the invention, a gap between adjacent two floating gates 112 is determined by the width 106 of the protruding part of the shallow trench isolation structure 102. The material of the shallow trench isolation structure 102 usually is silicon oxide with dielectric constant about 4.

Since the gap between adjacent two floating gates 112 is greatly reduced in the cell structure to reduce the cell size, the parasitic capacitance between the floating gates 112 is getting large when the gap between the floating gates 112 is reduced. The capacitance coupling may exist and be not negligible.

After at least looking into the issue above, the invention further provides embodiments. FIG. 3A to FIG. 3J are drawing, schematically illustrating process flows for fabricating a flash memory cell, according to an embodiment of the invention.

Figure 3A:
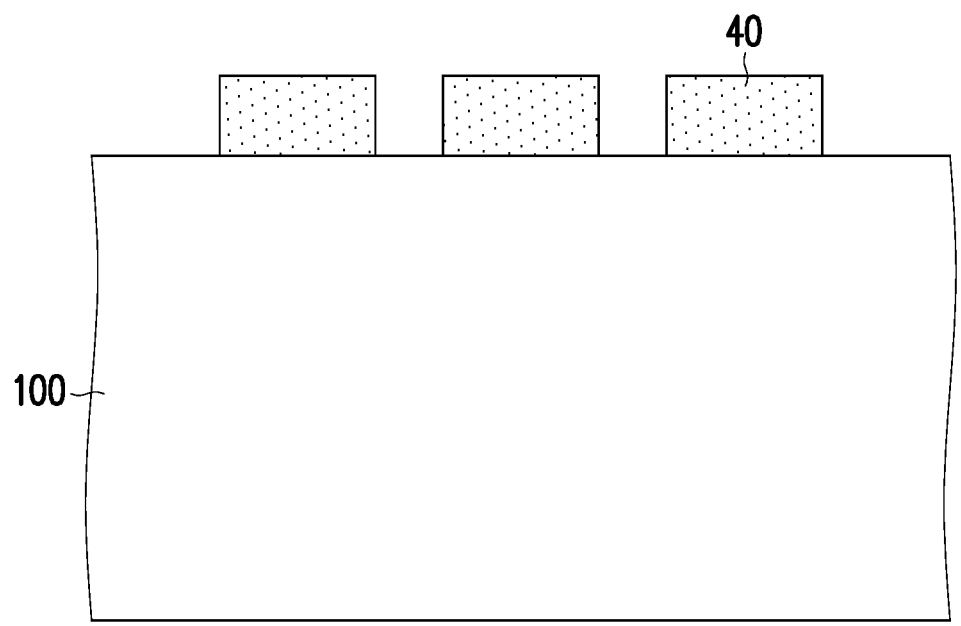
FIG. 3A to FIG. 3J are drawing, schematically illustrating process flows for fabricating a flash memory cell, according to an embodiment of the invention.

Referring to FIG. 3A, a substrate 100 is provided as a structure base. Dielectric islands 40 are formed on the substrate 100. The dielectric islands 40 are sacrificial material, such as silicon nitride, but the locations are preserved to form floating gates, which would replace the dielectric islands 40 in later fabrication process.

Figure 3B:
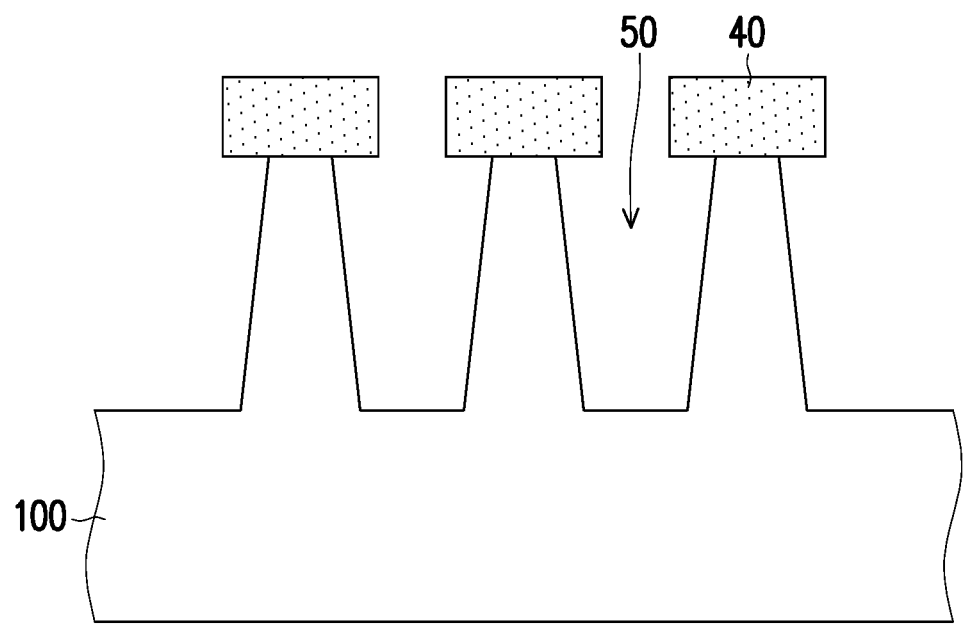
Figure 3C:
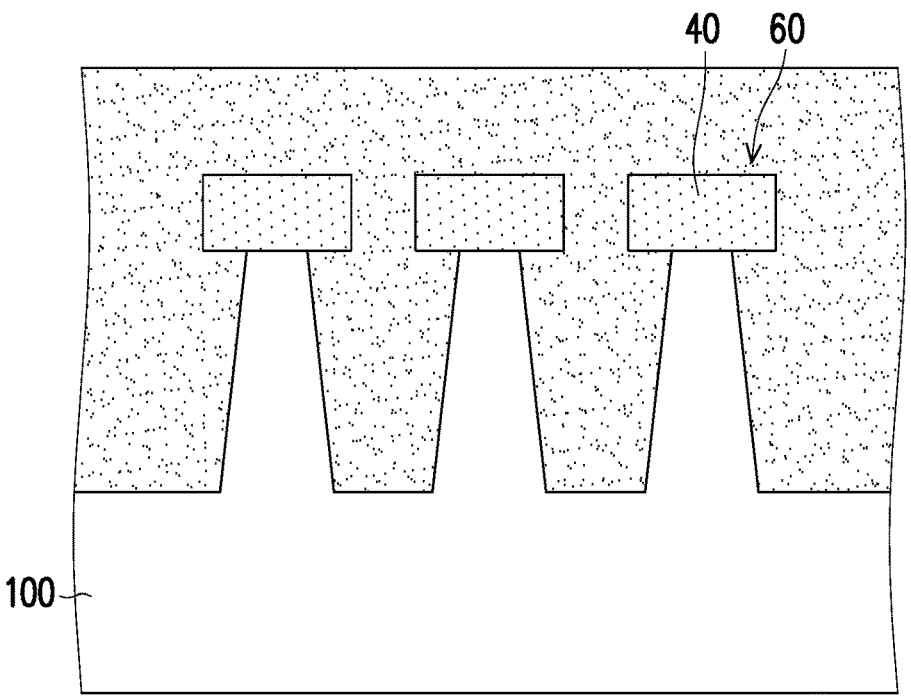

Referring to FIG. 3B, the substrate 100 is etched to form a pattern of shallow trench 50. As noted, the shallow trench 50 may extend into the bottom of the dielectric islands 40. Referring to FIG. 3C, an oxide layer 60 is further disposed over the substrate 100 to fill into the shallow trench 50 and the cover the dielectric islands 40. The dielectric islands 40 in an embodiment is nitride, different from the oxide layer 60.

Figure 3D:
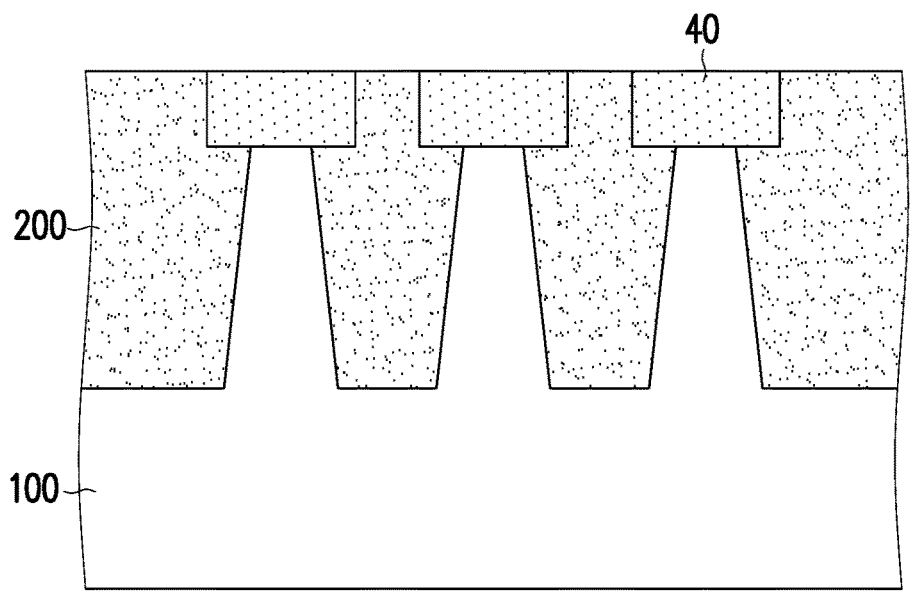

Referring to FIG. 3D, a polishing process, such as chemical mechanical polishing (CMP) process, is performed over the substrate 100 to polish the oxide layer 60 until the dielectric islands 40 is exposed. The remaining portion of the oxide layer 60 forms a shallow trench isolation structure 200.

Figure 3E:
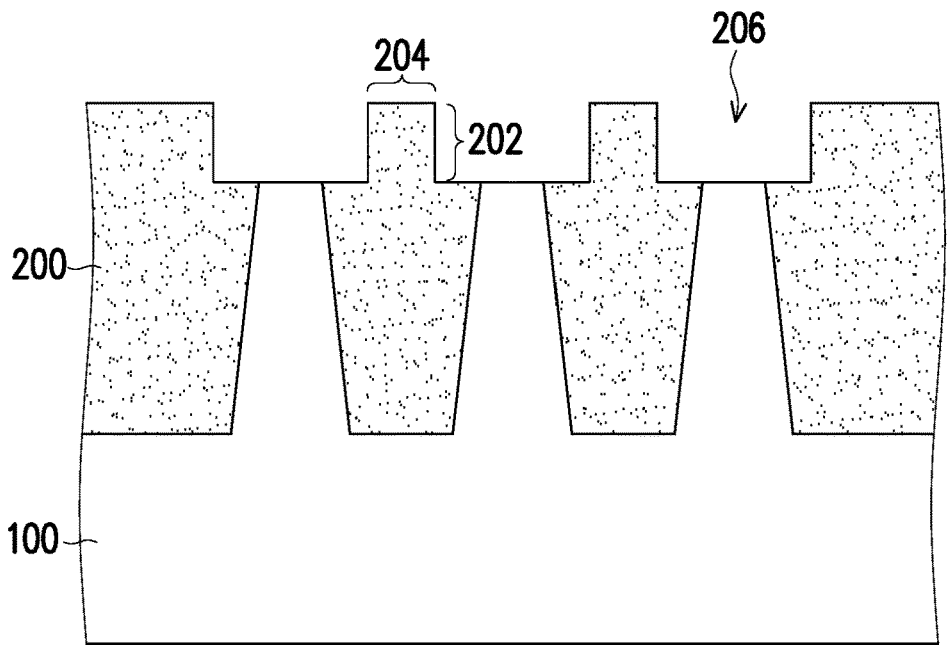

Referring to FIG. 3E, in an embodiment, the dielectric islands 40, such as nitride, is removed by an etching process with an etching selection ratio to the nitride. Then the indent region 206 is formed on the substrate 100. The indent region 206, similar to FIG. 2A, is a region between the protruding parts 202 of the shallow trench isolation structure 200. The protruding parts 202 of the shallow trench isolation structure 200 has a width 204 as viewed at the cross-section structure.

Figure 3F:
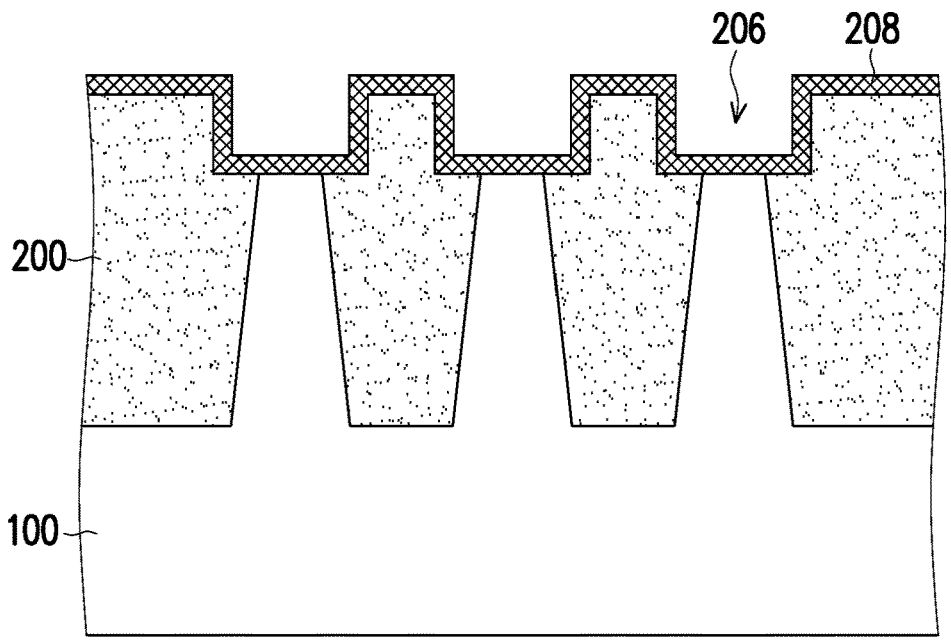

Referring to FIG. 3F, a low dielectric constant (low-K) dielectric layer 208 is formed over the substrate 100, being conformal with the protruding parts 202 of the shallow trench isolation structure 200 and the indent region 206. The low-K dielectric layer 208 has dielectric constant less than 4 being relative to the silicon oxide. The thickness of the low-K dielectric layer 208 would determine how much the parasitic capacitance is reduced, as to be see in subsequent processes. In other words, the thickness of the low-K dielectric layer 208 is preset.

Figure 3G:
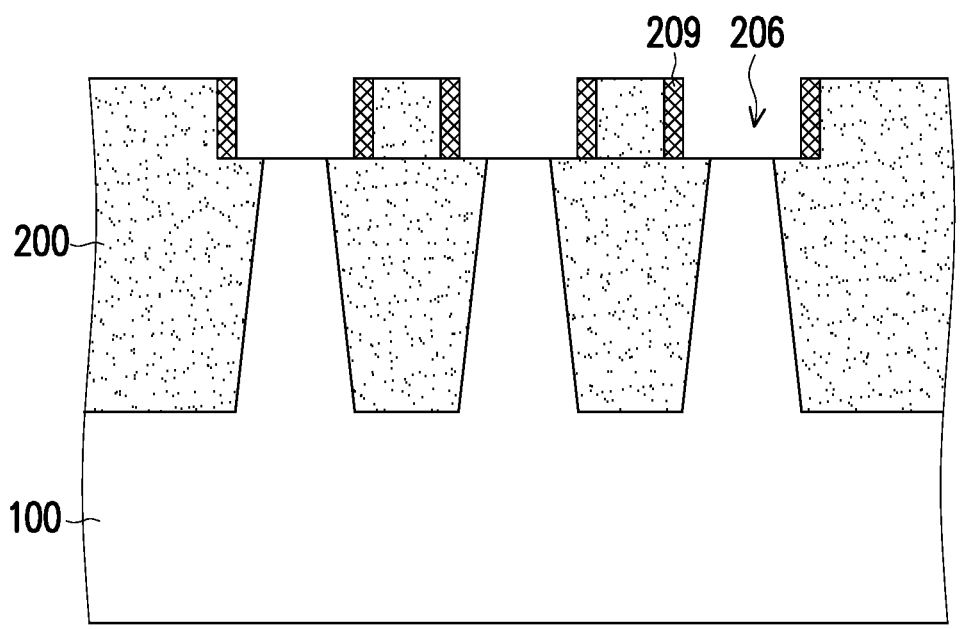

Referring to FIG. 3G, an etching back process is performed on the low-K dielectric layer 208, so to form a low-K spacer 209 on sidewall of the protruding parts 202 of the shallow trench isolation structure 200.

Figure 3H:
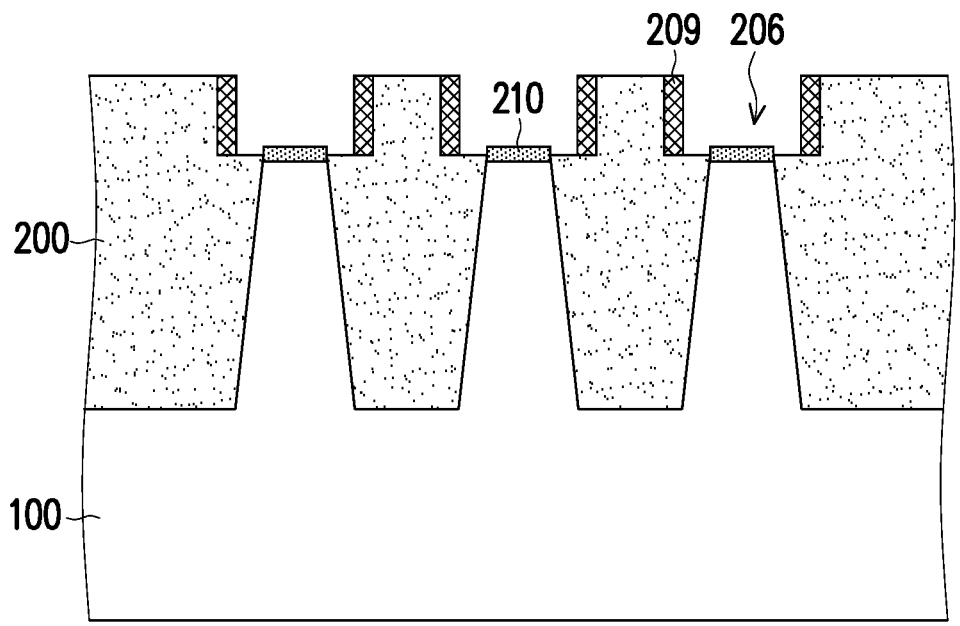

Referring to FIG. 3H, a tunnel oxide layer 210 is formed on the exposed surface of the substrate 100 within the indent region 206.

Figure 3I:
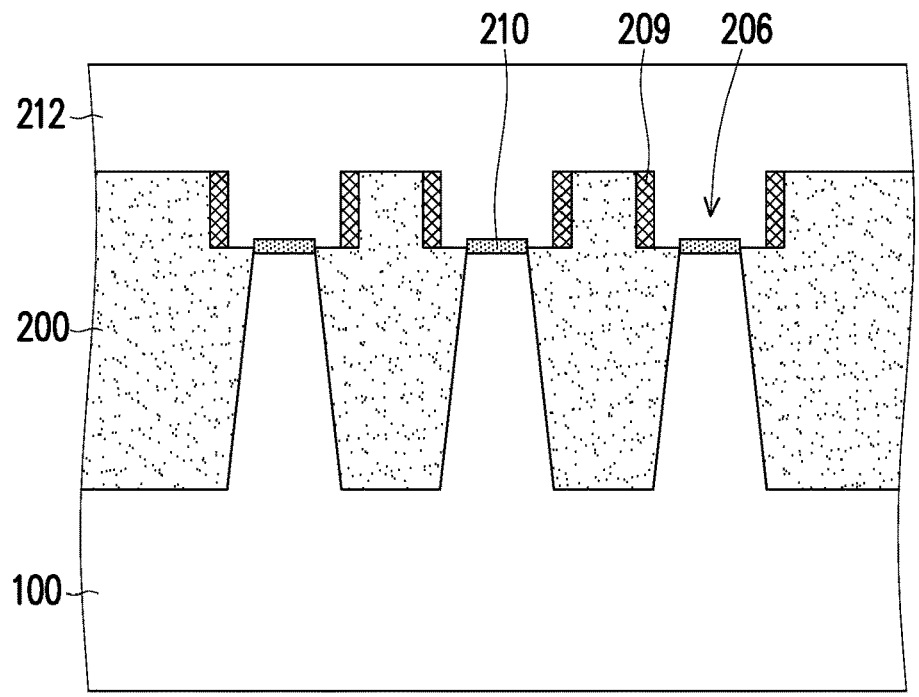

Referring to FIG. 3I, a polysilicon layer 212 is disposed over the substrate 100 to fill the indent region 206.

Figure 3J:
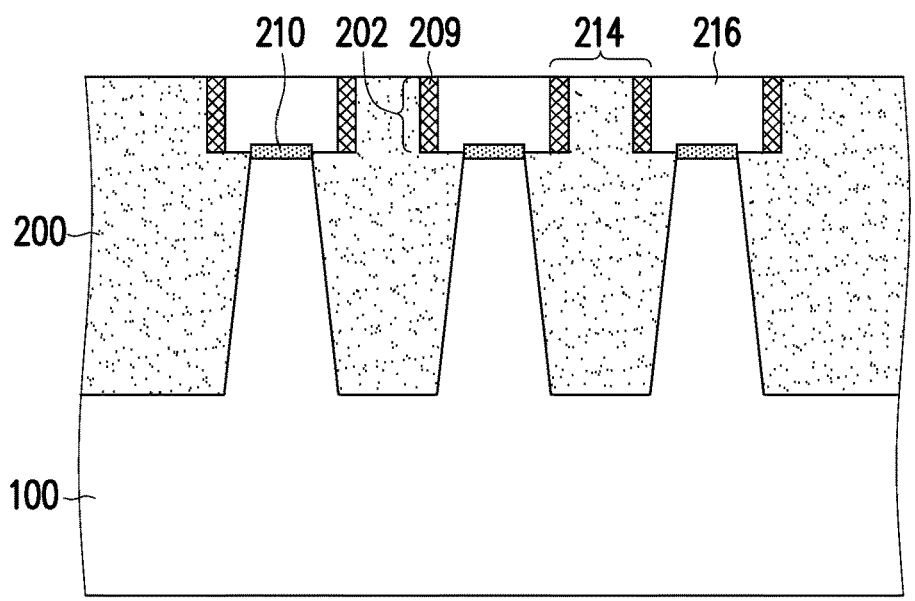

Referring to FIG. 3J, the polysilicon layer 212 is polished to expose the protruding parts 202 of the shallow trench isolation structure 200. The remaining portion of the polysilicon layer 212 forms floating gates 216.

In this structure, the low-K spacer 209 is also disposed on a sidewall of the floating gate 216. In other words, the low-K spacer 209 is sandwiched between the protruding parts 202 of the shallow trench isolation structure 200 and the floating gate 216. The distance between the protruding parts 202 of the shallow trench isolation structure 200 may remain as preset. However, the gap 214 between the floating gates 216 may be increased because the width of the floating gates 216 is reduced due to low-K spacer 209. As a result, the parasitic capacitance at the gap 214 between the floating gates 216 is reduced by a total effect from the low-K spacer 209. The capacitance coupling between the floating gates 216 is reduced.

FIG. 4A to FIG. 4H are drawing, schematically illustrating process flows for fabricating a flash memory cell, according to an embodiment of the invention. In a further embodiment, referring to FIG. 4A, the structure as fabricated in FIG. 3E is taken for further fabrication in another embodiment.

Figure 4A:
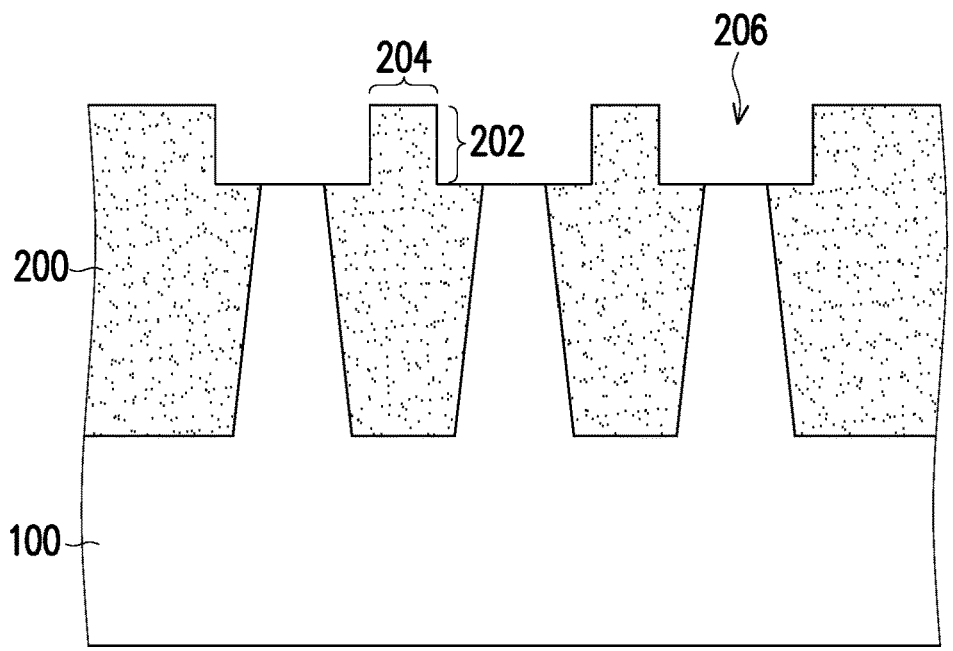
FIG. 4A to FIG. 4H are drawing, schematically illustrating process flows for fabricating a flash memory cell, according to an embodiment of the invention.
Figure 4B:
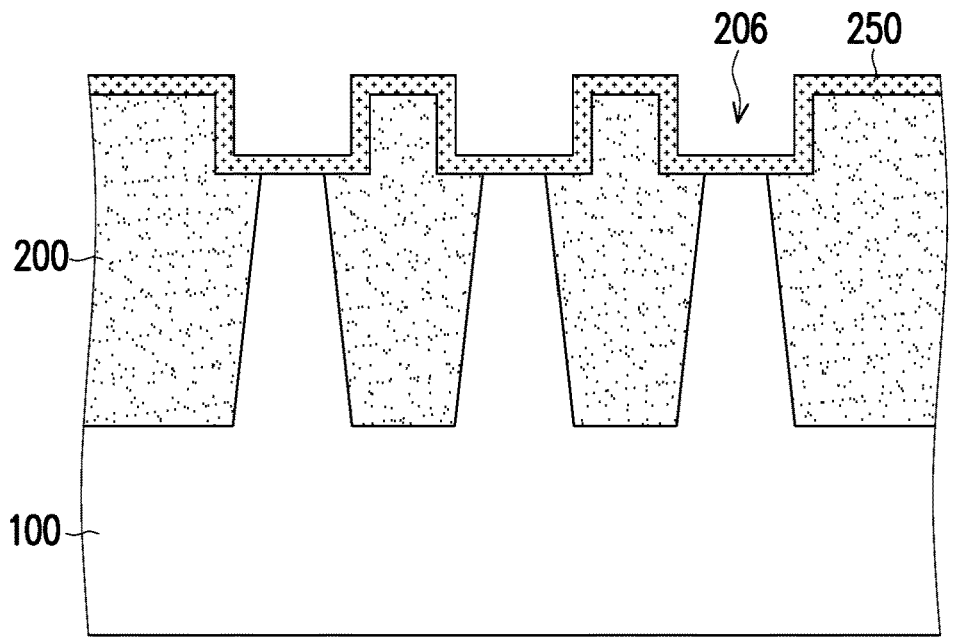

Referring to FIG. 4B, a sacrificial layer 250, such as nitride layer in different material from the oxide of the shallow trench isolation structure 200, is formed over the substrate 100 by a conformal structure.

Figure 4C:
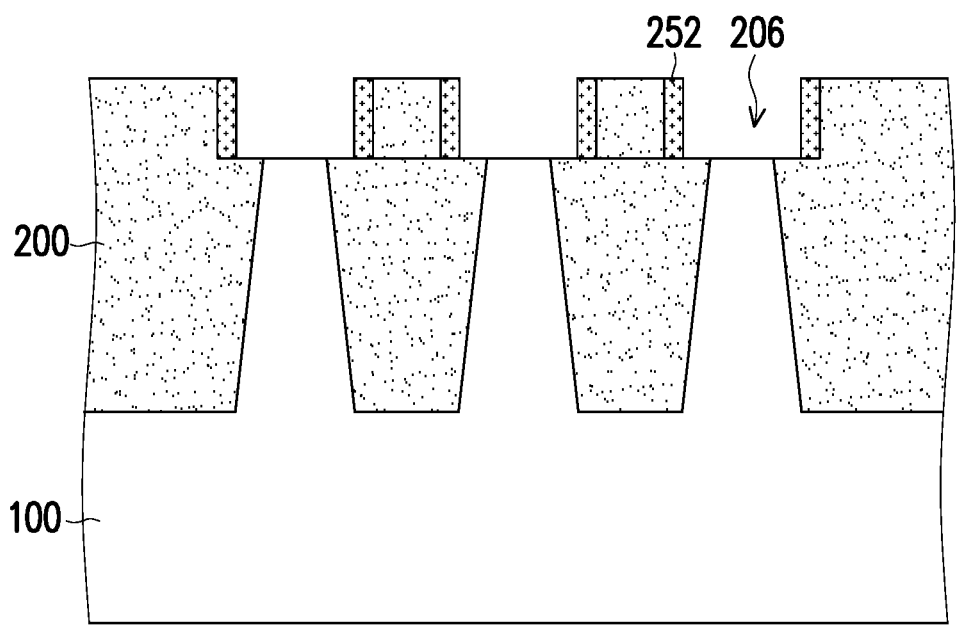

Referring to FIG. 4C, an etching back process is performed on the sacrificial layer 250 to form a sacrificial spacer 252.

Figure 4D:
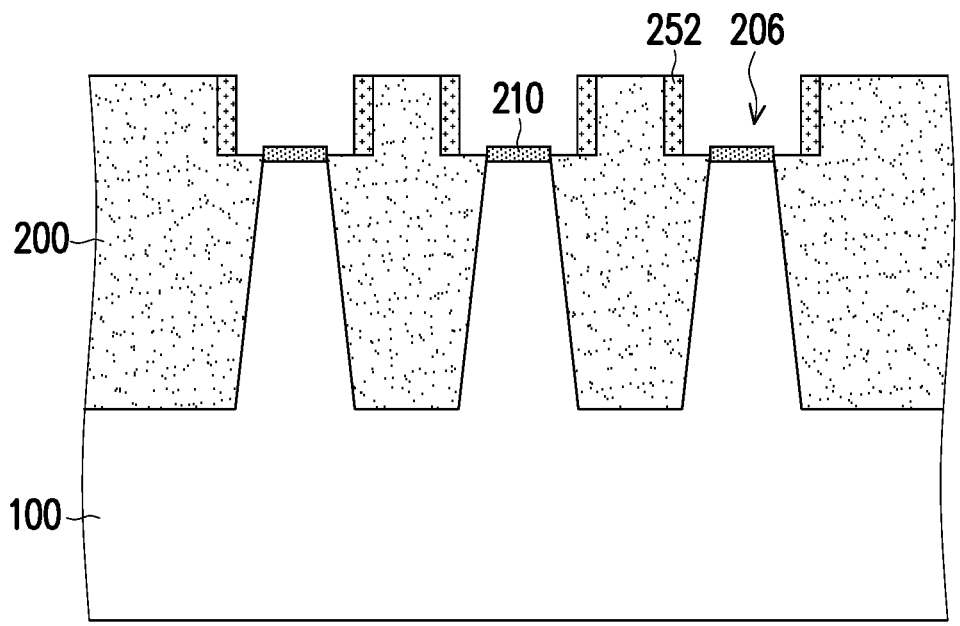

Referring to FIG. 4D, a tunnel oxide layer 210 is formed on the exposed surface of the substrate 100 within the indent region 206.

Figure 4E:
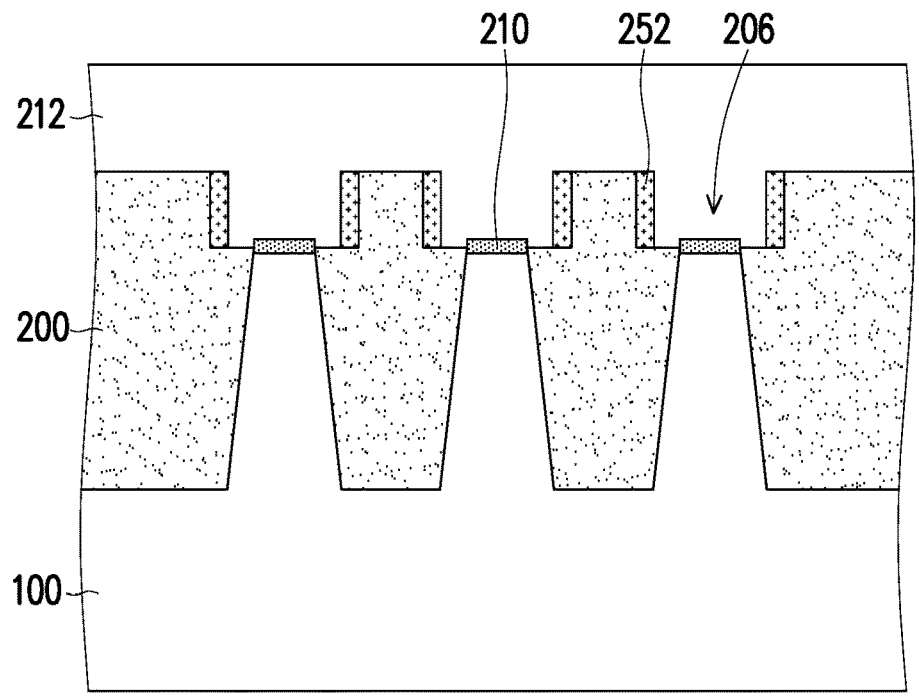

Referring to FIG. 4E, a polysilicon layer 212 is disposed over the substrate 100 to fill the indent region 206.

Figure 4F:
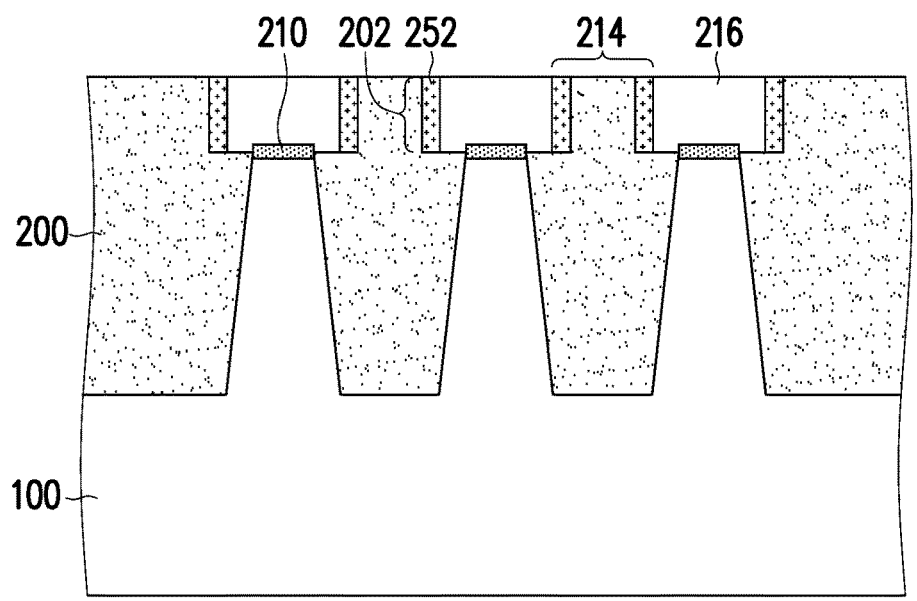

Referring to FIG. 4F, the polysilicon layer 212 is polished to expose the protruding parts 202 of the shallow trench isolation structure 200 and the sacrificial spacer 252. The remaining portion of the polysilicon layer 212 forms floating gates 216.

Figure 4G:
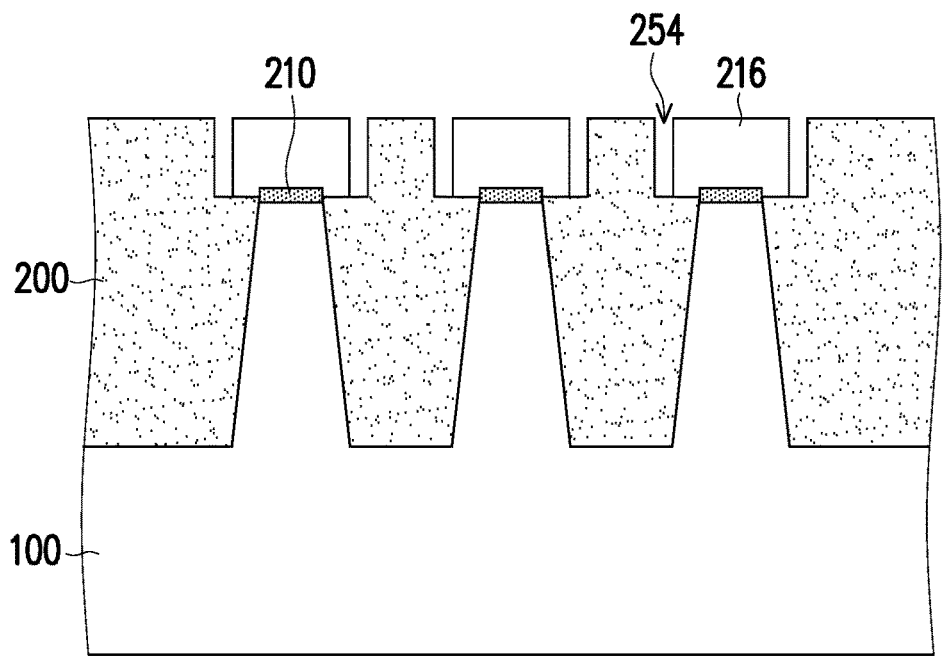

Referring to FIG. 4G, the sacrificial spacer 252 is removed by etching process in an embodiment, in which an etching selection ratio to the material of the sacrificial spacer 252, such as nitride, is set by a proper etchant. After the sacrificial spacer 252 is removed, a side space 254 is formed, serving as an air spacer, which has dielectric constant, rather close to 1.

Figure 4H:
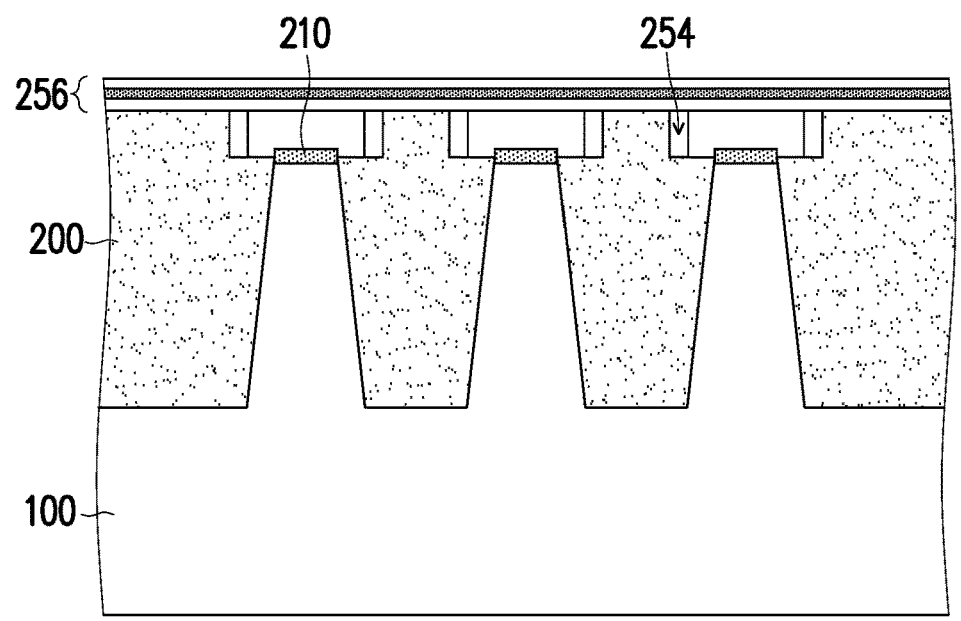

Referring to FIG. 4H, another dielectric layer 256 is formed on the floating gates 216, such as oxide/nitride/oxide (ONO) layer in an embodiment. As a result, the side spaces 254 are sealed as air spacers between the floating gates 216 and the protruding parts 202 of the shallow trench isolation structure 200. The parasitic capacitance is further reduced because the dielectric constant of the air is quite close to 1 while the dielectric constant for silicon oxide is about 4.

The invention has provided the flash memory cell, which has the low-K spacer on the sidewall of the floating gates to at least reduce the parasitic capacitance. The low-K spacer has dielectric constant less than silicon oxide. The low-K spacer may be the air medium with dielectric constant rather close to 1. The method for fabricating the flash memory cell, in an embodiment, is also provided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating flash memory, comprising:
providing a substrate;
forming a trench isolation structure, having a base part disposed in the substrate and a protruding part above the substrate protruding from the base part;
forming a dielectric spacer with low dielectric constant (low-K) on a sidewall of the protruding part of the trench isolation structure; and
forming a floating gate on the substrate abutting to the dielectric spacer, wherein the dielectric spacer is sandwiched between the floating gate and the protruding part of the trench isolation structure,
wherein a peripheral bottom flat surface of the floating gate directly covers on a portion of the base part of the trench isolation structure,
the method for fabricating flash memory further comprising performing an oxidation process on the substrate before forming the floating gate and after forming the trench isolation structure to form a tunnel oxide layer between the substrate and the floating gate,
wherein the dielectric spacer and the tunnel oxide layer are separated by a portion of the floating gate on the base part of the trench isolation structure,
wherein the step of forming the trench isolation structure comprises:
forming a plurality of dielectric islands on the substrate, wherein a gap is between adjacent two of the dielectric islands;
forming a trench in the substrate under the gap, wherein the trench extends into a bottom of the dielectric islands;
depositing an isolation material over the substrate to fill the trench and cover over the dielectric islands;
polishing the isolation material to expose the dielectric islands, wherein the protruding part of the trench isolation structure is formed between the dielectric islands; and
removing the dielectric islands.

2. The method for fabricating flash memory in claim 1, wherein a dielectric constant of the dielectric spacer is smaller than a dielectric constant of the trench isolation structure.

3. The method for fabricating flash memory in claim 1, further comprising removing the dielectric spacer to have a free space filled with air.

4. The method for fabricating flash memory in claim 1, wherein the tunnel oxide layer is disposed on the substrate between adjacent two of the base part of the trench isolation structure after forming the trench isolation structure.

5. The method for fabricating flash memory in claim 1, wherein a top surface of the dielectric spacer is coplanar with a top surface of the floating gate.

6. The method for fabricating flash memory in claim 1, wherein a dielectric constant of the dielectric spacer is smaller than a dielectric constant of silicon oxide.

7. The method for fabricating flash memory in claim 1, wherein the step of forming the floating gate comprising:
   depositing a polysilicon layer over the substrate to at least cover over the protruding part of the trench isolation structure with the dielectric spacer; and
   polishing the polysilicon layer to expose the protruding part of the trench isolation structure with the dielectric spacer, wherein a residual part of the polysilicon layer provides the floating gate.

* * * * *